United States Patent
Huang et al.

(10) Patent No.: US 11,804,255 B2
(45) Date of Patent: Oct. 31, 2023

(54) AMPLIFIER INPUT PAIR PROTECTION

(71) Applicant: Micron Technology, Inc., Boise, ID (US)

(72) Inventors: Zhi Qi Huang, Xuhui (CN); Wei Lu Chu, Pudong (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/393,597

(22) Filed: Aug. 4, 2021

(65) Prior Publication Data

US 2023/0044187 A1     Feb. 9, 2023

(51) Int. Cl.
*G11C 11/4074* (2006.01)
*G05F 3/26* (2006.01)
*H03F 3/45* (2006.01)

(52) U.S. Cl.
CPC .......... *G11C 11/4074* (2013.01); *G05F 3/262* (2013.01); *H03F 3/45269* (2013.01); *H03F 3/45273* (2013.01)

(58) Field of Classification Search
CPC ..... G11C 11/4074; G11C 7/062; G11C 7/065; G05F 3/262; H03F 3/45269; H03F 3/45273; G01R 19/165; G01R 19/16566; G01R 19/1659; G01R 19/0038; H03K 5/2418; H03K 5/2445; H03K 5/2481
See application file for complete search history.

(56) References Cited

U.S. PATENT DOCUMENTS 7,936,207 B2 * 5/2011  Im ....................... G11C 11/4074
                                                          327/543

* cited by examiner

*Primary Examiner* — Jung Kim
(74) *Attorney, Agent, or Firm* — Fletcher Yoder, P.C.

(57) ABSTRACT

A memory device includes a voltage generator configured to generate a reference voltage for transmission to at least one component of the memory device. The voltage generator includes a first input to receive a first signal having a first voltage value. The voltage generator also includes a second input to receive a second signal having a second voltage value. The voltage generator further includes a first circuit configured to generate third voltage and a second circuit coupled to the first circuit to receive the third voltage value, wherein the second circuit receives the first signal and the second signal and is configured to utilize the third voltage value to facilitate comparison of the first voltage value and the second voltage value to generate an output voltage.

16 Claims, 3 Drawing Sheets

AMPLIFIER INPUT PAIR PROTECTION

BACKGROUND

Field of the Present Disclosure

Embodiments of the present disclosure relate generally to the field of semiconductor devices. More specifically, embodiments of the present disclosure relate to memory amplifier protection circuitry.

Description of Related Art

Generally, electronic devices, such as semiconductor devices, memory chips, microprocessor chips, image chips, and the like, may include one or more amplifier circuits, which may be circuits that can be used in as voltage generators, such as generators that generate reference voltages used in the electronic devices. However, in implementing voltage generators, there may be competing goals between the accuracy of the voltage generator (e.g., its ability to consistently generate predetermined or requested voltage levels) and protection of the circuitry of the voltage generator to ensure the reliability of the voltage generator. Moreover, traditional protection schemes for voltage generators in electronic devices often rely on external (global) routings, which can increase the size and complexity of implementing these voltage generators, which can cause issues as the size of the electronic devices continues to be reduced.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Voltage generators (e.g., reference voltage generators) are used in electronic devices, such as memory devices, to generate usable voltages having a selected or predetermined level. However, exposure to supply or other input voltages that exceed a particular threshold level can cause degradation and/or failure in the Voltage generator that causes the actual amount of voltage generated to vary from its expected value or can cause the voltage generator to cease operation. Accordingly, present embodiments provide protection and circuitry to protect voltage generators when in operation.

Figure 1:
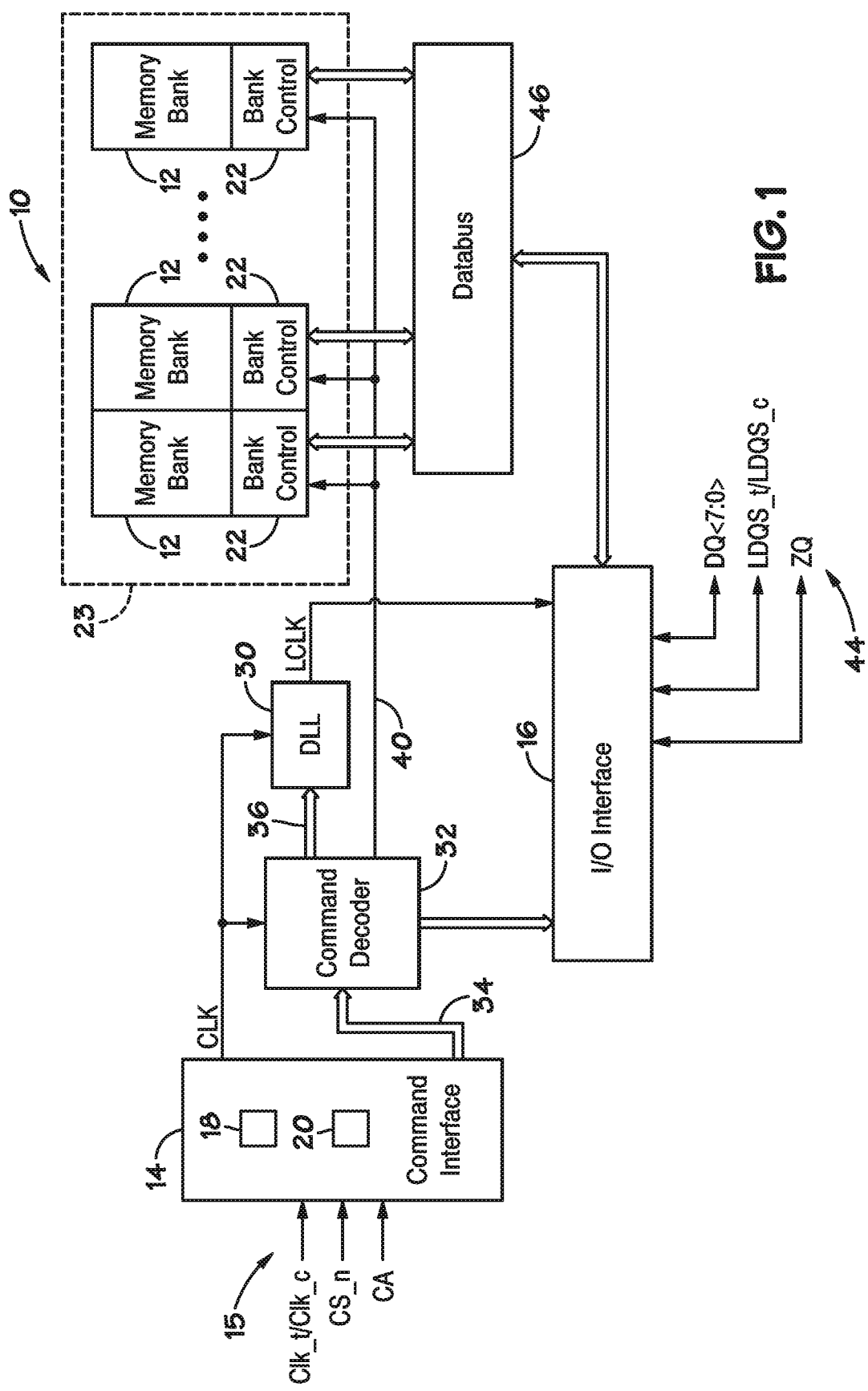
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be may be a random access memory (RAM) device, a dynamic RAM (DRAM) device, a static RAM (SRAM) device (including a double data rate SRAM device), flash memory, or a double data rate type four synchronous dynamic random access memory (DDR4 SDRAM) device, or a double data rate type five synchronous dynamic random access memory (DDR5 SDRAM) device.

The memory device 10 may include a number of memory banks 12. The memory banks 12 may be DDR4 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x4, x8, or x16 memory chips), as will be appreciated. Each SDRAM memory chip may include one or more memory banks 12. The memory device 10 represents a portion of a single memory chip (e.g., SDRAM chip) having a number of memory banks 12. The memory device 10 represents a portion of a single memory chip (e.g., SDRAM chip) having a number of memory banks 12. It should be appreciated that various other configurations, organization and sizes of the memory banks 12 on the memory device 10 may be utilized depending on the application and design of the overall system and the type of memory employed.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA bus. Access to specific banks 12 within the memory device 10 is encoded on the CA bus with the commands. In addition, the command interface 14 may be configured to receive a number of other command signals and other memory types may employ different signals received by the command interface 14.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, the IO signals may be divided into upper and lower bytes. For instance, for an x16 memory device, the IO signals may be divided into upper and lower IO signals corresponding to upper and lower bytes of the data signals, for instance.

Additionally, to allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, the differential pairs of DQS signals may be divided into upper and lower data strobe signals corresponding to upper and lower bytes of data sent to and from the memory device 10.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/Vss external to the memory device 10. This resistor acts as a reference for adjusting internal ODT and drive strength of the IO pins.

As will be appreciated, various other components such as power supply circuits (for receiving external Vdd and Vss signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

Figure 2:
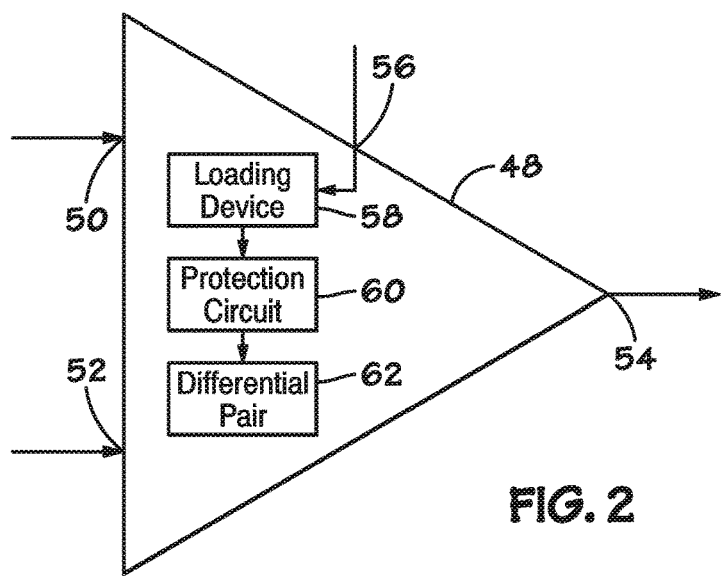
FIG. 2 is a block diagram of a voltage reference generator of the memory device of FIG. 1, according to an embodiment of the present disclosure.

One circuit that can be utilized in conjunction with the memory device 10 of FIG. 1 is a reference voltage generator, which may, for example, be utilized in the reading out of data from the memory banks 12. FIG. 2 illustrates a schematic diagram of a reference voltage generator 48, which may be, for example, an amplifier. As illustrated, the reference voltage generator 48 may include an input 50 (e.g., a pin, connection, or the line) and an input 52, whereby the input 50 represents a positive terminal of an amplifier and the input 52 represents a negative terminal of the amplifier. The reference voltage generator 48 additionally includes an output 54 (e.g., a pin, connection, or the like) that operates to output an amplified signal, i.e., a reference voltage at a particular voltage. Additionally illustrated is a supply input 56 that receives a supply voltage.

Figure 3:
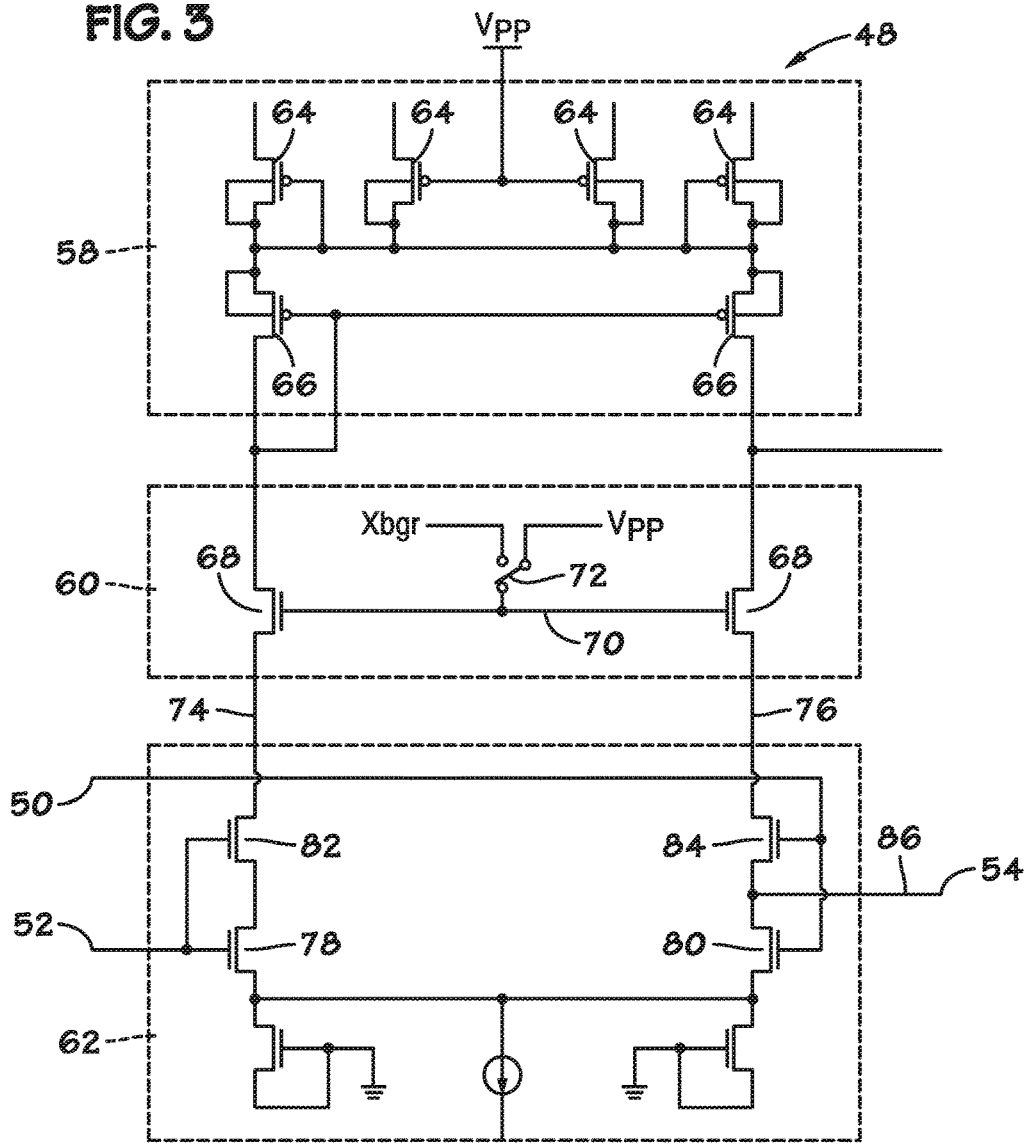
FIG. 3 is a circuit diagram of a first embodiment of the voltage reference generator of FIG. 2, according to an embodiment of the present disclosure.

In some embodiments, the reference voltage generator 48 additionally includes a loading device 58 (i.e., loading circuitry), a protection circuit 60, and a differential transistor pair 62. The loading device 58 may operate to receive and condition the supply voltage received from supply input 56. The protection circuit 60 may operate to insure that the voltage provided to the differential transistor pair 62 is at or below a threshold value. The differential transistor pair 62 includes circuitry that applies gain to the difference between the input signals received at the input 50 and the input 52, which may be transmitted as a resultant signal from output 54 of the reference voltage generator 48. FIG. 3 illustrates a first example of circuitry utilized in the protection circuit 60 of the reference voltage generator 48.

As illustrated in FIG. 3, the loading device 58 includes one or more transistors 64 (e.g., p-channel metal oxide semiconductor field effect transistors (MOSFETs)) that operate to condition a received voltage, for example, Vpp (e.g., a programming power voltage that may operate as a voltage supply that supplies the potential and energy for altering the state of certain nonvolatile memory arrays and/or that acts as a program enable signal (P)). Additionally illustrated as part of the loading device 58 are two additional transistors 66 (e.g., p-channel MOSFETS). As will be discussed below, the transistors 66 may be part of a current mirror with circuitry of the protection circuit 60.

As illustrated, the protection circuit 60 includes a pair of transistors 68 (e.g., n-channel MOSFETS) each coupled to one of the transistors 66. The gate of each of the transistors 68 is coupled to a (common) path 70. This path 70 is coupled, via a switch 72, to one of at least two voltage sources. As illustrated, the switch 72 operates to select one of the at least two voltage sources to provide that corresponding voltage to the gates of the transistors 68. In one embodiment, a first voltage source is a band gap reference voltage (Vbgr) which may represent a voltage source independent of process variance, temperature changes, and voltage changes. As additionally illustrated, the second voltage source illustrated in FIG. 3 is Vpp. Furthermore, the transistors 68 are each coupled to one of the transistors 66 to effect a current mirror so that the currents supplied on each of paths 74 and 76 to the differential transistor pair has a common value.

As additionally, illustrated in FIG. 3, the differential transistor pair 62 includes transistor 78 and transistor 80 (e.g., n-channel MOSFETS) as the differential pair of transistors as well as transistor 82 and transistor 84 (e.g., n-channel MOSFETS) as an input pair of transistors. As illustrated, the gate of each of transistor 78 and 82 is coupled to the input 50 (e.g., the positive terminal of the reference voltage generator 48). Likewise, the gate of each of transistor 80 and 84 is coupled to the input 52 (e.g., the negative terminal of the reference voltage generator 48). This configuration allows for the amplification of differences in voltages at input 50 and input 52, which may be output to the output 54 along path 86.

In some embodiments, the voltage supplied along each of paths 74 and 76 should be at or below a preset value so as to protect the transistors 78, 80, 82, and 84 and to extend the life of the differential transistor pair 62. The voltage supplied along each of paths 74 and 76 may operate as a source voltage utilized by the transistors 78, 80, 82, and 84 in operation, for example, as a voltage (e.g., a source voltage or operational voltage) provided to the source of the transistors 78, 80, 82, and 84 for utilization in the differential amplification performed by the differential transistor pair 62. Moreover, the voltage supplied along each of paths 74 and 76 is controlled by the gate voltage transmitted along path 70. However, different memory devices 10 have differing values for each of Vbgr and Vpp.

For example, when the memory device 10 is a DDR4 device, Vpp is 2.5V. When this voltage is applied to the gate of transistors 68, the voltage level at paths 74 and 76 is too high of a level to protect the transistors 82 and 84. Likewise when the memory device 10 is a DDR4 device, Vbgr is 1.24V. This level of voltage leads to a resultant voltage on paths 74 and 76 that is too low for proper operation (e.g., the voltage transmitted to the transistor 82 and the transistor 84 causes the transistors 82 and 84 to operate in the linear region, causing loss of DC gain and failure of the amplification function of the reference voltage generator 48).

One technique to alleviate the above noted issues would be to supply an additional voltage to the switch 72 from a source external to the reference voltage generator 48 and/or to replace one of the source voltages (Vbgr or Vpp) with a source voltage received from a source external to the reference voltage generator 48. However, this technique may have one or more issues. For example, this technique may cause increased complexity in routing (due to the additional voltage path supplied to the reference voltage generator 48). Additionally, the external voltage source may be disposed at a distance from the reference voltage generator 48, which can cause issues related to signal path length (i.e., the voltage received at the reference voltage generator 48 may be derogated or otherwise impacted due to the signal path transmission length).

Figure 4:
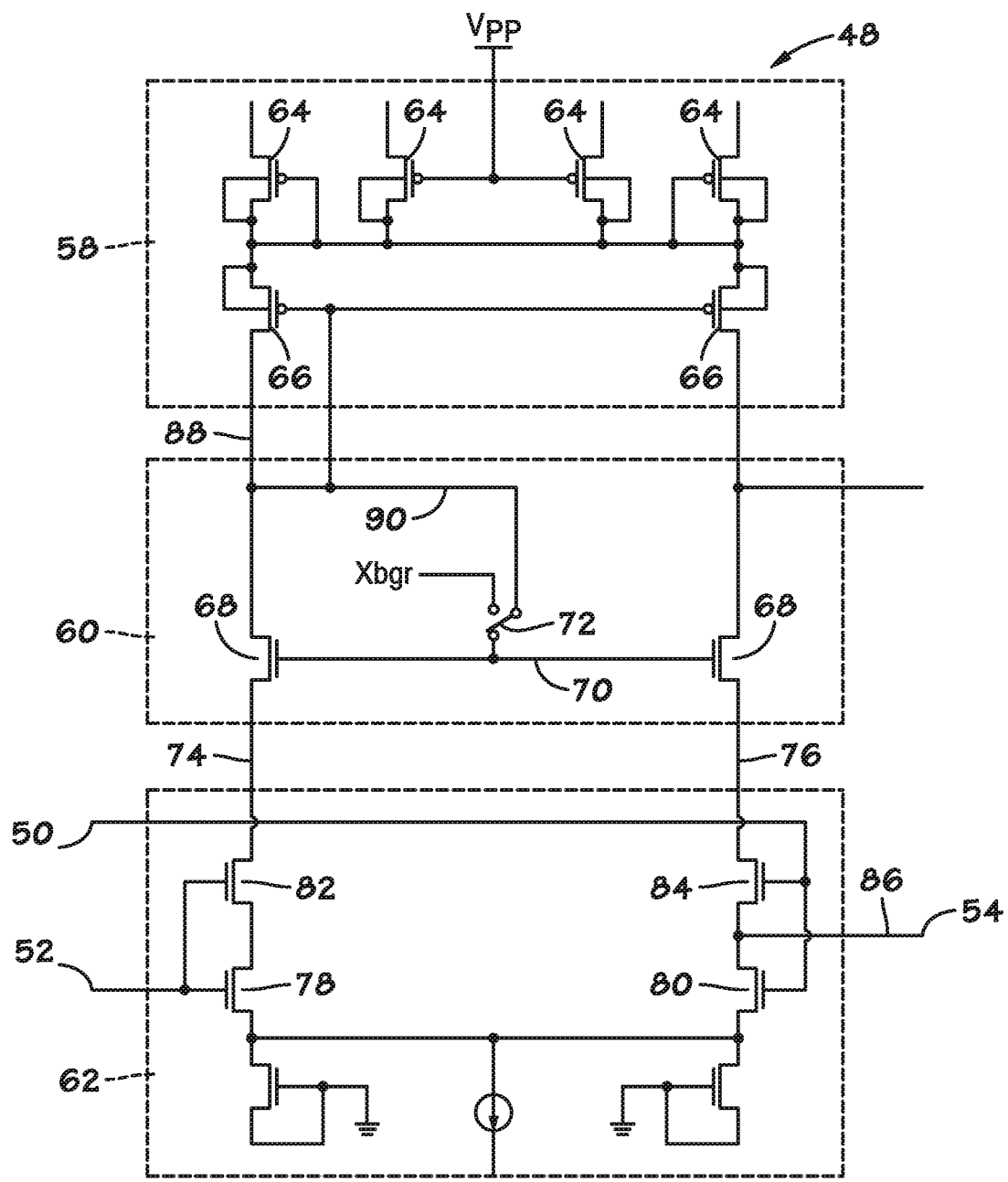
FIG. 4 is a circuit diagram of a second embodiment of the voltage reference generator of FIG. 2, according to an embodiment of the present disclosure.

Accordingly, a second technique and circuit for the internal generation of a source voltage at a predetermined level for selection by the switch 72 is illustrated in FIG. 4. FIG. 4 illustrates the reference voltage generator 48 inclusive of the loading device 58, the protection circuit 60, and the differential transistor pair 62. As illustrated, the protection circuit 60 includes the switch 72 that when in operation selects one of the at least two voltage sources to provide that corresponding voltage to the gates of the transistors 68. While the first voltage source corresponds to Vbgr (in some embodiments, the first voltage source can instead be Vpp), the second voltage source is generated internal to the reference voltage generator 48. More particularly, the voltage exiting the loading device 58 (e.g., Vth) along path 88 is transmitted to transistor 68, as a gate voltage signal to the transistors 66, and along path 90 as the second voltage source for selection by the switch 72.

In some embodiments, the circuitry of the loading device 58 may be selected (e.g., the voltage may be tuned thorough the selection of the circuitry of the loading device 58) such that the output voltage (Vth) is, for example, approximately 1.5V, 1.6V, 1.7V, approximately between 1.5V and 1.7V or another value. In this manner, for example, in conjunction with the memory device 10 being a DDR4 device, the Vth is generated (e.g., selected then generated at a predetermined level via selection of the circuitry of the loading device 58) and supplied via switch 72 to the gates of transistors 68 and has a predetermined voltage level that is less than the Vpp and greater than the Vbgr of the memory device 10. This predetermined level for Vth can be selected to protect the differential transistor pair 62 from excess voltages being applied thereto while preventing the input pair of transistors 82 and 84 from operating in their linear region. In this manner, the voltage along path 74 is clamped (i.e., through selective application of a predetermined voltage on gates of the transistors 68 of the protection circuit 60, the voltage along path 74 will not exceed or fall below a value or a range of values). In some embodiments, use the protection circuit 60 (inclusive of thick oxide transistors as transistors 68) may allow for the use of thin N-channel transistors as transistors 78, 80, 82, and 84 in the differential transistor pair 62 while not exposing the transistors 78, 80, 82, and 84 to voltages that would harm or otherwise impair their operation and/or lifespan.

Additionally, improved DC gain can be accomplished utilizing the protection circuit 60 described above in conjunction with the differential transistor pair 62, as the voltage transmitted along path 74 (and path 76) can be selected to cause the transistors 78, 80, 82, and 84 to operate in their saturation region. This can be accomplished by insuring that the voltage transmitted to the differential transistor pair 62 is between to predetermined values. The voltage is generated to be between a first high voltage value above which the reliability of the differential transistor pair 62 will be affected and a second low voltage value below which the transistors 78, 80, 82, and 84 will operate in their linear region. Each reference voltage generator 48 can have these two limits established as set points and the voltage applied to the gates of the transistors 68 can be generated to result in a voltage along path 74 that is between the predetermined limits.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
   a voltage generator configured to generate a reference voltage for transmission to at least one component of the memory device, wherein the voltage generator comprises:
   a first input to receive a first signal having a first voltage value;
   a second input to receive a second signal having a second voltage value;
   a first circuit configured to generate a third voltage; and
   a second circuit coupled to the first circuit to receive the third voltage, wherein the second circuit receives the first signal and the second signal and is configured to utilize the third voltage to facilitate comparison of the first voltage value and the second voltage value to generate an output voltage, wherein the first circuit comprises a protection circuit as the first circuit, wherein the protection circuit is configured to transmit the third voltage to the second circuit, wherein the voltage generator comprises a loading device coupled to the protection circuit, wherein the loading device is configured to generate and transmit a fourth voltage to the protection circuit, wherein the protection circuit is configured to receive the fourth voltage, wherein the protection circuit comprises a selector configured to select the fourth voltage as a selected voltage.

2. The memory device of claim 1, wherein the protection circuit comprises a transistor coupled to the selector.

3. The memory device of claim 2, wherein the transistor comprises a gate configured to receive the selected voltage.

4. The memory device of claim 3, wherein the transistor is configured to operate in a first manner based upon the selected voltage.

5. The memory device of claim 4, wherein the transistor generates the third voltage based on the selected voltage.

6. The memory device of claim 2, wherein the loading device comprises a third circuit configured to generate the fourth voltage as having a predetermined value.

7. The memory device of claim 1, wherein the memory device comprises a DDR4 memory device.

8. A memory device comprising:
   a voltage generator configured to generate a reference voltage for transmission to at least one component of the memory device, wherein the voltage generator comprises:
   a first input to receive a first signal having a first voltage value;
   a second input to receive a second signal having a second voltage value;
   a first circuit configured to generate a third voltage;
   a second circuit coupled to the first circuit to receive the third voltage, wherein the second circuit receives the first signal and the second signal and is configured to utilize the third voltage to facilitate comparison of the first voltage value and the second voltage value to generate an output voltage; and
   a loading device coupled to the first circuit and configured to generate and transmit a fourth voltage to the first circuit, wherein the first circuit is configured to receive the fourth voltage, wherein the first circuit comprises a selector configured to select the fourth voltage as a selected voltage.

9. The memory device of claim 8, wherein the first circuit is configured to transmit the third voltage to the second circuit.

10. The memory device of claim 8, wherein the first circuit comprises a transistor coupled to the selector.

11. The memory device of claim 10, wherein the transistor comprises a gate configured to receive the selected voltage.

12. The memory device of claim 11, wherein the transistor is configured to operate in a first manner based upon the selected voltage.

13. The memory device of claim 12, wherein the transistor generates the third voltage based on the selected voltage.

14. The memory device of claim 8, wherein the loading device comprises a third circuit configured to generate the fourth voltage as having a predetermined value.

15. The memory device of claim 8, wherein the memory device comprises a DDR4 memory device.

16. A method, comprising:
generating a reference voltage via a voltage generator con for transmission to at least one component of a memory device;
receiving a first signal having a first voltage value at a first input of the voltage generator;
receiving a second signal having a second voltage value at a second input of the voltage generator;
generating a third voltage via a first circuit of the voltage generator;
receiving the third voltage at a second circuit of the voltage generator from the first circuit wherein the second circuit receives the first signal and the second signal;
utilizing the third voltage at the second circuit to facilitate comparison of the first voltage value and the second voltage value to generate an output voltage;
generating a fourth voltage at a loading device of the voltage generator, wherein the loading device is coupled to the first circuit;
transmitting the fourth voltage from the loading device to the first circuit; and
selecting the fourth voltage as a selected voltage via a selector of the first circuit.

* * * * *